(12) United States Patent
Lee et al.

(10) Patent No.: US 8,912,551 B2
(45) Date of Patent: Dec. 16, 2014

(54) SUBSTRATE ASSEMBLY FOR CRYSTAL GROWTH AND FABRICATING METHOD FOR LIGHT EMITTING DEVICE USING THE SAME

(75) Inventors: Chung Hoon Lee, Ansan-si (KR); Kyung Hee Ye, Ansan-si (KR); Dae Sung Cho, Ansan-si (KR); Won Cheol Seo, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 13/640,943

(22) PCT Filed: Apr. 7, 2011

(86) PCT No.: PCT/KR2011/002454
§ 371 (c)(1),
(2), (4) Date: Oct. 12, 2012

(87) PCT Pub. No.: WO2011/129548
PCT Pub. Date: Oct. 20, 2011

(65) Prior Publication Data
US 2013/0026498 A1 Jan. 31, 2013

(30) Foreign Application Priority Data
Apr. 12, 2010 (KR) .................. 10-2010-0033113

(51) Int. Cl.
*H01L 33/48* (2010.01)
*H01L 33/00* (2010.01)
(52) U.S. Cl.
CPC .................. *H01L 33/0079* (2013.01)
USPC .............................. 257/79; 438/28

(58) Field of Classification Search
CPC ..... H01L 33/207; H01L 33/079; H01L 33/20; H01L 33/24; H01L 33/007; H01L 33/0079
USPC ........... 257/76, 79, E33.056; 428/472.2, 698, 428/212, 448; 438/28
See application file for complete search history.

(56) References Cited

U.S. PATENT DOCUMENTS 5,786,606 A 7/1998 Nishio et al.
5,905,275 A * 5/1999 Nunoue et al. .................. 257/95

(Continued)

FOREIGN PATENT DOCUMENTS

JP 09-223819 8/1997
JP 2004-512688 4/2004

(Continued)

OTHER PUBLICATIONS

International Search Report dated Dec. 23, 2011 issued for PCT/KR2011/002454.

(Continued)

*Primary Examiner* — Whitney T Moore
(74) *Attorney, Agent, or Firm* — H.C. Park & Associates, PLC

(57) ABSTRACT

A substrate assembly on which a first conduction-type semiconductor layer, an active layer and a second conduction-type semiconductor layer are formed is disclosed, the substrate assembly comprising a first substrate, a second substrate and a bonding layer interposed there between. In the substrate assembly, the thermal expansion coefficient of the bonding layer is smaller than or equal to that of at least one of the first and second substrates.

18 Claims, 4 Drawing Sheets

(56) References Cited

U.S. PATENT DOCUMENTS

| | | |
|---|---|---|
| 2004/0026709 A1 | 2/2004 | Bader et al. |
| 2008/0296584 A1 | 12/2008 | Hachigo |
| 2009/0291518 A1* | 11/2009 | Kim et al. ............... 438/33 |
| 2010/0289040 A1* | 11/2010 | Seo et al. ............... 257/91 |
| 2011/0156212 A1 | 6/2011 | Arena |

FOREIGN PATENT DOCUMENTS

| | | |
|---|---|---|
| JP | 2009-252897 | 10/2009 |
| KR | 10-2009-0004462 | 1/2009 |
| WO | 2010-024987 | 3/2010 |

OTHER PUBLICATIONS

Written Opinion dated Dec. 23, 2011 issued for PCT/KR2011/002454.

* cited by examiner

SUBSTRATE ASSEMBLY FOR CRYSTAL GROWTH AND FABRICATING METHOD FOR LIGHT EMITTING DEVICE USING THE SAME

CROSS-REFERENCE TO RELATED APPLICATIONS

This application is the National Stage of International Application PCT/KR2011/002454, filed on Apr. 7, 2011, and claims priority from and the benefit of Korean Patent Application No. 10-2010-0033113, filed on Apr. 12, 2010, both of which are incorporated herein by reference for all purposes as if fully set forth herein.

BACKGROUND

1. Field

The present invention relates to a substrate assembly for crystal growth and a fabricating method of a light emitting device using the same. More particularly, the present invention relates to a substrate assembly for crystal growth including a bonding layer and a is fabricating method of a light emitting device using the substrate assembly.

2. Discussion of the Background

In general, since Group-III-element nitrides, such as GaN and AlN, have an excellent thermal stability and a direct-transition-type energy band structure, the Group-III-element nitrides have recently come into the spotlight as materials for light emitting devices in visual and ultraviolet regions. Particularly, blue and green light emitting devices using InGaN have been used in various applications such as large-sized full-color flat panel displays, traffic lights, indoor illumination, high-density light sources, high-resolution output systems and optical communications.

Since it is difficult to fabricate a homogeneous substrate that enables such a Group III-element nitride semiconductor layer to be grown thereon, the Group III-element nitride semiconductor layer has been grown on a heterogeneous substrate having a similar crystal structure using a process such as metal oxide chemical vapor deposition (MOCVD) or molecular beam epitaxy (MBE). For example, a sapphire substrate is used as the heterogeneous substrate. That is, if MOCVD is used to fabricate a nitride semiconductor layer, an epitaxial layer of GaN semiconductor crystals is grown on a sapphire substrate by supplying an organic metal compound gas as a reaction gas into a reaction chamber in which the sapphire substrate is mounted as a growth substrate and maintaining the crystal growth temperature to be a high temperature of about 900 to 1100° C.

Meanwhile, the size of the substrates commercialized as growth substrates is is about 2 inches, but it tends to be gradually increased because of the mass production and the reduction in the fabrication cost.

However, the bending of a substrate depending on the crystal growth temperature is necessarily considered during the crystal growth. Accordingly, the thickness of the substrate is gradually increased as the size of the substrate is increased.

Accordingly, in order to use a dicing process of cutting a growth substrate into individual chips after the crystal growth is completed, the thickness of the substrate is necessarily decreased from 450 μm to 100 μm, for example, for a 2-inch substrate, through a lapping process. As the size and thickness of the substrate is increased, the time and the cost spent for the process are increased.

Further, if the substrate is thick during the crystal growth, the temperature variation in the substrate is increased. For example, the large temperature difference between top and bottom portions of the substrate may allow cracks to be generated in the substrate.

Therefore, even though the size and thickness of a substrate for growing a light emitting device is increased, it is required to develop a substrate assembly for crystal growth, which can prevent the time and the cost required for a fabricating process of the light emitting device from being excessively increased and prevent the cracks in the substrate during the crystal growth from be generated.

SUMMARY OF THE INVENTION

An object of the present invention is to provide a substrate assembly for crystal growth and a fabricating method of a light emitting device using the same, which even though the size and thickness of a substrate for growing the light emitting device are increased, cannot require the long time and the large cost for dicing and lapping processes and may prevent the cracks in the substrate from be generated due to the temperature variation in the substrate during the crystal growth process.

According to an aspect of the present invention, there is provided a substrate assembly having a first conduction-type semiconductor layer, an active layer and a second conduction-type semiconductor layer formed thereon, the substrate assembly comprising a first substrate; a second substrate; and a bonding layer interposed between the first and second substrates, wherein the thermal expansion coefficient of the bonding layer is smaller than or equal to that of at least one of the first and second substrates.

Preferably, the first and second substrates are homogeneous substrates.

Preferably, the first and second substrates are sapphire substrates.

Preferably, the bonding layer is made of at least one selected from the group consisting of a nitride semiconductor, a silicon oxide ($SiO_x$), a silicon nitride ($SiN_x$), a mixture thereof, and a metal, including Ti, Cr, Ni, Cu, W, Au and Ag or an alloy thereof.

Preferably, the bonding layer is formed on a top surface of at least one of the first and second substrates using plasma enhanced chemical vapor deposition (PECVD), sputtering or plating.

According to another aspect of the present invention, there is provided a fabricating method of a light emitting device, comprising the steps of: preparing first and second substrates; forming a bonding layer on at least one of the first and second substrates; bonding the first and second substrates to each other through the bonding layer; forming a semiconductor lamination structure on the first substrate; removing the bonding layer and the second substrate; and grinding the first substrate to have a desired thickness.

Preferably, the first and second substrates are homogeneous.

Preferably, the first and second substrates are sapphire substrates.

Preferably, the bonding layer is made of at least one selected from the group consisting of a nitride semiconductor, a silicon oxide ($SiO_x$), a silicon nitride ($SiN_x$), a mixture thereof, and a metal, including Ti, Cr, Ni, Cu, W, Au and Ag or an alloy thereof.

Preferably, the bonding layer is formed using at least one of PECVD, sputtering and plating.

Preferably, the method may further comprise a step of dicing the first substrate to have a predetermined size.

According to the present invention, there is provided a substrate assembly for crystal growth and a fabricating method of a light emitting device using the same, which, even though the size and thickness of a substrate for growing the light emitting device is increased, cannot require the long time and the large cost for dicing and lapping processes and may prevent the cracks in the substrate from being generated due to the temperature variation in the substrate during the crystal growth process.

DETAILED DESCRIPTION OF THE ILLUSTRATED EMBODIMENTS

Figure 1:
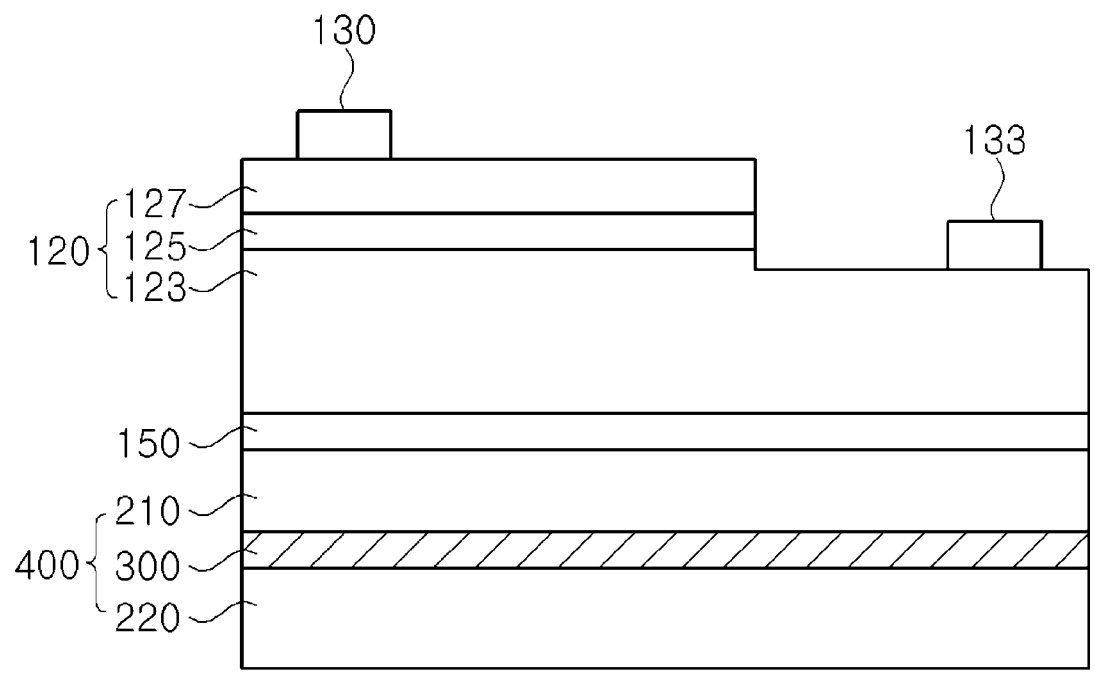
FIG. 1 is a sectional view illustrating a substrate assembly according to an embodiment of the present invention.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements are exaggerated for convenience of illustration. Like reference numerals indicate like elements throughout the specification and drawings.

FIG. 1 is a sectional view illustrating a substrate assembly according to an embodiment of the present invention.

Referring to FIG. 1, the substrate assembly 400 according to the embodiment of the present invention includes a first substrate 210, a second substrate 220 and a bonding layer 300. A semiconductor lamination structure 120 including an N-type semiconductor layer 123, an active layer 125, a P-type semiconductor layer 127, a P-type electrode pad 130, an N-type electrode pad 133 and a buffer layer 150 may be formed on the substrate assembly.

Here, any substrate on which light emitting devices might be mounted in a highly dense manner may be used as the first substrate 210. For example, the first substrate 210 may be formed of at least one material of alumina, quartz, calcium zirconate, forsterite, SiC, graphite, fused silica, mullite, cordierite, zirconia, beryllia, aluminum nitride, low temperature co-fired ceramic (LTCC) and sapphire. However, the present invention is not limited thereto.

The second substrate 220 may be formed of a material which is identical to or different from that of the first substrate 210. Since a sapphire substrate is excellently stable under a high-temperature ammonia atmosphere in an epitaxial growth process using MOCVD, the first and second substrates 210 and 220 are preferably formed of sapphire substrates having a hexagonal system structure. Hereinafter, the first and second substrates 210 and 220 are considered as substrates formed of the same material (e.g., sapphire).

The first and second substrates 210 and 220 have the same size that is about 2 to 6 inches. In consideration of the bending of a substrate due to a high temperature, it is preferable that the first and second substrates 210 and 220 have a thickness of about 450 µm or more when their size is about 4 to 6 inches, and it is more preferable that they have a thickness of about 240 µm when their size is about 2 inches.

The bonding layer 300 is an adhesive layer formed between the first and second substrates 210 and 220 so as to allow the first and second substrates 210 and 220 to be bonded to each other. The bonding layer 300 may serve to decrease the temperature variation between the first and second substrates 210 and 220 by absorbing heat during the crystal growth using MOCVD. The bonding layer 300 will be described later.

The N-type semiconductor layer 123 may be formed of N-type $Al_xIn_yGa_{1-x-y}N$ ($0 \leq x, y, x+y \leq 1$), and may include an N-type clad layer. Further, the P-type semiconductor layer 127 may be formed of P-type $Al_xIn_yGa_{1-x-y}N$ ($0 \leq x, y, x+y \leq 1$), and may include a P-type clad layer. The N-type semiconductor layer 123 may be doped with a dopant such as Si, Ge, Se, Te or C. The P-type semiconductor layer 127 may be doped with a dopant such as Zn, Mg or Be, for example.

These semiconductor layers 123 and 127 may be grown using a known deposition process such as MOCVD, MBE or hybrid vapor phase epitaxy (HVPE).

A transparent electrode layer (not shown) made of a metal or metal oxide such as Ni/Au, indium tin oxide (ITO), transparent conductive oxide (TCO) or zinc oxide (ZnO) may be formed on the P-type semiconductor layer 127. The P-type electrode pad 130 may be formed on a partial region of a top surface of the transparent electrode layer.

The active layer 125 is limitedly formed on a partial region of a top surface of the N-type semiconductor layer 123 by mesa etching, and the P-type semiconductor layer 127 is formed on the active layer 125. Thus, the partial region of the top surface of the N-type semiconductor layer 123 is bonded to the active layer 125, and the other region of the top surface is exposed to the outside. The N-type electrode pad 133 may be formed on the exposed portion.

The active layer 125 is a region in which electrons and holes are recombined, and is includes InGaN. The wavelength of the light extracted from a light emitting cell is determined depending on the kind of the material that constitutes the active layer 125. The active layer 125 may be a multi-layered film in which quantum well layers and barrier layers are repeatedly formed. The barrier layers and the quantum well layers may be binary to quaternary compound semiconductor layers expressed by a general formula of $Al_xIn_yGa_{1-x-y}N$ ($0 \leq x, y, x+y \leq 1$).

The buffer layer 150 may be interposed between the substrate assembly 400 and the N-type semiconductor layer 123. The buffer layer 150 is used to reduce the lattice mismatch between the first substrate 210 and the semiconductor layers to be formed on top of the buffer layer 150. If the first substrate 210 is insulative like sapphire, the buffer layer 150 may be formed of a conductive material. On the other hand, if the first substrate 210 is conductive, the buffer layer 150 may be formed of an insulating or semi-insulating material so that the first substrate 210 and the semiconductor lamination structure 120 are electrically insulated from each other. For example, the buffer layer 150 may be formed of a nitride such as AlN or GaN.

Figure 3:
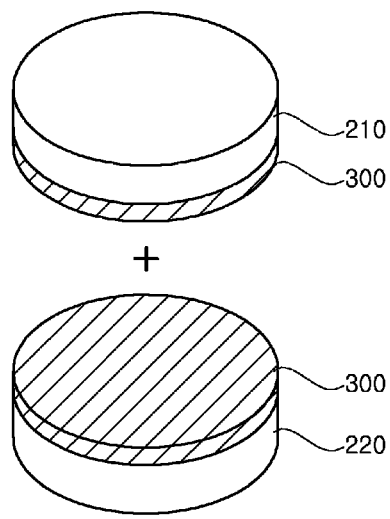
Figure 4:
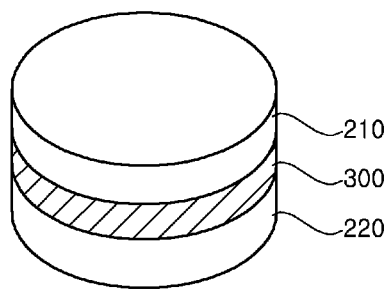

Hereinafter, a process of fabricating the substrate assembly according to the embodiment of the present invention will be described with reference to FIGS. 2 to 4.

Figure 2:
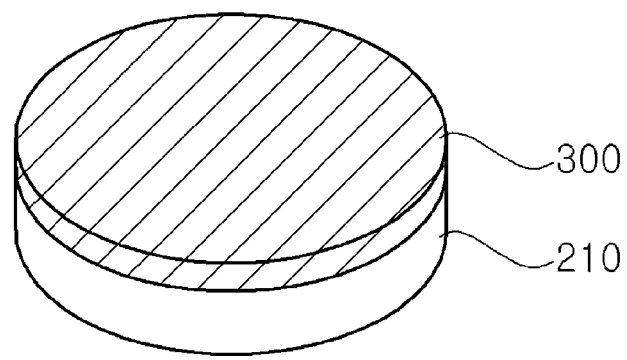
FIGS. 2 to 4 are perspective views illustrating a process of fabricating the substrate assembly according to the embodiment of the present invention.

Referring to FIG. 2, the bonding layer 300 is formed on a top surface of the first substrate 210. The bonding layer 300 may be formed on a top surface of the second substrate 220 as well as on the top surface of the first substrate 210. That is, FIG. 3 shows that the is bonding layer 300 is formed on both the top surfaces of the first and second substrates 210 and 220.

At this time, the bonding layer 300 may be made of at least one selected from the group consisting of a nitride semiconductor such as AlInGaN, a silicon oxide ($SiO_x$) such as $SiO_2$, a silicon nitride ($SiN_x$) such as $Si_3N_4$, a mixture thereof, a metal such as Ti, Cr, Ni, Cu, W, Au and Ag or an alloy thereof, and another insulator.

When the material that constitutes the bonding layer 300 is selected, it is advantageous that the thermal expansion coefficient of the bonding layer 300 is selected to be equal to those of the first and second substrates 210 and 220, i.e., the sapphire substrates or it is more preferable that the thermal expansion coefficient of the bonding layer 300 is selected to be smaller than those of the sapphire substrates. This is provided for the purpose of preventing a phenomenon that the sapphire substrates may be bent toward the nitride semiconductor as the temperature in a chamber for the crystal growth increases. The bonding layer 300 absorbs heat, so that it is possible to decrease the temperature variation between the sapphire substrates, thereby preventing the sapphire substrates from being bent or preventing the cracks from being produced in the sapphire substrates. Moreover, it is possible to prevent the sapphire substrates from being bent outward from the nitride semiconductor at room temperature.

For example, the thermal expansion coefficient of sapphire is 6 to $\mu m/m \cdot K$, the is thermal expansion coefficient of SiC is 4.3 $\mu m/m \cdot K$, the thermal expansion coefficient of AlN is 4.5 $\mu m/m \cdot K$, and the thermal expansion coefficient of GaN is 5.59 $\mu m/m \cdot K$.

The bonding layer 300 may be formed on the top surface of the first or second substrate 210 or 220 through a process such as plasma enhanced chemical vapor deposition (PECVD), sputtering or plating.

Subsequently, referring to FIGS. 3 and 4, the first and second substrates 210 and 220 are bonded to each other through the bonding layer 300, thereby fabricating the substrate assembly 400.

Specifically, if the bonding layer 300 is formed on both the top surfaces of the first and second substrates 210 and 220, the top surfaces of the substrates, on which the bonding layer 300 is formed, are disposed opposite to each other. Alternatively, if the bonding layer 300 is formed on the top surface of only one of the substrates, the top surface of the one substrate, on which the bonding layer 300 is formed, is disposed opposite to one surface of the other substrate. Then, both the substrates 210 and 220 are bonded to each other under a high temperature and/or a high pressure. For example, if the bonding layer 300 is formed of Au, both the substrates 210 and 220 can be bonded to each other, even though both the substrates 210 and 220 are heated under the high pressure at a temperature which is equal to or smaller than the melting point (about 400 degrees) of Au.

Figure 5:
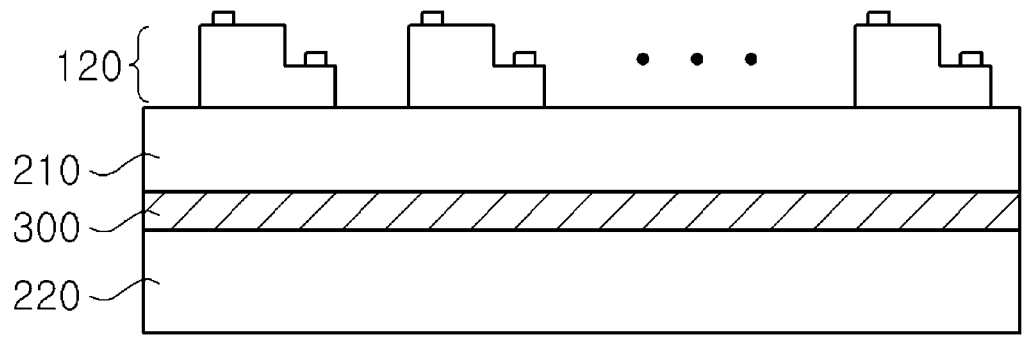
FIG. 5 is a sectional view showing the substrate assembly having semiconductor lamination structures formed on a top surface thereof according to the embodiment of the present invention.
Figure 6:
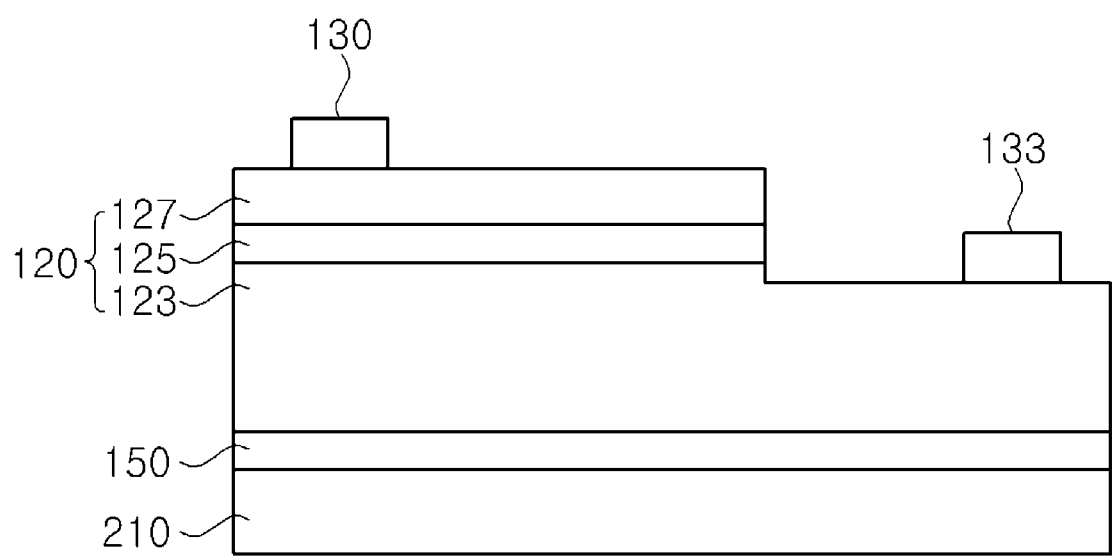
FIG. 6 is a sectional view showing a light emitting device according to the embodiment of the present invention.

FIG. 5 is a sectional view showing the substrate assembly having semiconductor lamination structures formed on the top surface thereof according to the embodiment of the present invention, and FIG. 6 is a sectional view showing a light emitting device according to the embodiment of the present invention.

Referring to FIGS. 5 and 6, a plurality of light emitting devices may be fabricated by forming a plurality of semiconductor lamination structures 120 on the top surface of the first substrate 210 that is one of both the substrates 210 and 220 bonded to each other through the bonding layer 300, separating the first substrate 210 from the bonding layer 300 and the second substrate 220 and then cutting the first substrate 210 having the plurality of semiconductor lamination structures 120 into individual light emitting devices through a dicing process.

Figure 7:
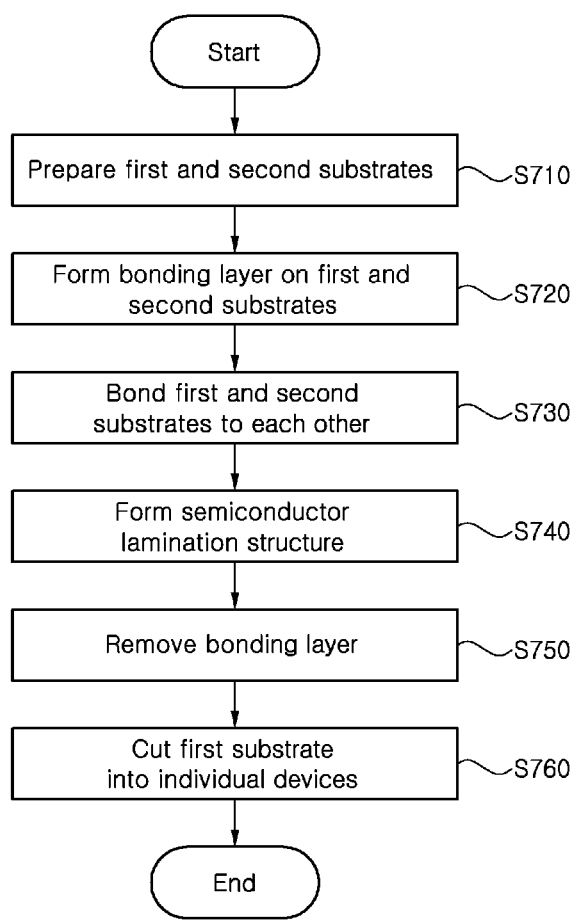
FIG. 7 is a flowchart illustrating a process of fabricating a light emitting device is according to the embodiment of the present invention.

FIG. 7 is a flowchart illustrating a fabricating method of a light emitting device according to the embodiment of the present invention. It will be understood by those skilled in the art that the steps in the fabricating method of the light emitting device, which will be described below, may be partially omitted or may be changed in their processing order depending on the embodiments.

First, first and second substrates 210 and 220 are prepared (S710). Here, any substrate on which light emitting devices might be mounted in a highly dense manner may be used as the first substrate 210. For example, the first substrate 210 may be formed of at least is one material of alumina, quartz, calcium zirconate, forsterite, SiC, graphite, fused silica, mullite, cordierite, zirconia, beryllia, aluminum nitride, low temperature co-fired ceramic (LTCC) and sapphire. However, the present invention is not limited thereto.

The second substrate 220 may be formed of a material which is identical to or different from that of the first substrate 210.

The first and second substrates 210 and 220 have a size of about 2 to 6 inches. For example, the first and second substrates 210 and 220 may be prepared by cutting a sapphire ingot with a diameter of about 2 to 6 inches to have a predetermined thickness. At this time, the thicknesses of the first and second substrates 210 and 220 may be changed depending on their size. In consideration of the bending of a substrate due to a high temperature, it is preferable that the first and second substrates 210 and 220 have a thickness of about 450 $\mu m$ or more when their size is about 4 to 6 inches, and it is more preferable that they have a thickness of about 240 $\mu m$ when their size is about 2 inches.

Subsequently, a bonding layer 300 is formed on at least one of the first and second substrates 210 and 220 (S720). Here, the material of the bonding layer 300 may be made of at least one selected from the group consisting of a nitride semiconductor such as AlInGaN, a silicon oxide ($SiO_x$) such as $SiO_2$, a silicon nitride ($SiN_x$) such as $Si_3N_4$, a mixture thereof, a metal such as Ti, Cr, Ni, Cu, W, Au and Ag or an alloy thereof, and another insulator.

When the material that constitutes the bonding layer 300 is selected, it is advantageous that the thermal expansion coefficient of the bonding layer 300 is selected to be equal to those of the first and second substrates 210 and 220, i.e., the sapphire substrates or, it is more preferable that the thermal expansion coefficient of the bonding layer 300 is selected to be smaller than those of the sapphire substrates. This is provided for the purpose of preventing the phenomenon that the sapphire substrates may be bent toward the nitride semiconductor as the temperature in a chamber for the crystal growth increases.

In another embodiment, a material having a thermal expansion coefficient substantially equal to or greater than that of the GaN layer (semiconductor layer) formed on a growth substrate may be selected to constitute the bonding layer 300. This is provided for the purpose of preventing the phenomenon that the growth substrate may be bent toward the nitride semiconductor as the temperature in the chamber for the crystal growth increases.

Thus, the material of the bonding layer 300 is preferably selected so that the thermal expansion coefficient of the bonding layer 300 is equal to or greater than that of the semiconductor layer formed on the substrate 210 and is equal to and smaller than that of the substrate (210 or 220).

The bonding layer 300 may be formed on top surface(s) of the substrate(s) 210 and/or 220 through a process such as PECVD, sputtering or plating.

Subsequently, the first and second substrates 210 and 220 are bonded to each other through the bonding layer 300 (S730). That is, if the bonding layer 300 is formed on both the top surfaces of the first and second substrates 210 and 220, the top surfaces of the substrates, on which the bonding layer 300 is formed, are disposed opposite to each other. Alternatively, if the bonding layer 300 is formed on the top surface of only one of the substrates, the top surface of the one substrate, on which the bonding layer 300 is formed, is disposed opposite to one surface of the other substrate. Then, both the substrates 210 and 220 are bonded to each other under a high temperature and/or a high pressure. By doing so, a substrate assembly 400 is formed in which both the substrates 210 and 220 are bonded to each other through the bonding layer 300.

Subsequently, semiconductor lamination structures 120 are formed on the substrate assembly 400 (S740). To reduce the lattice mismatch, a buffer layer 150 may be formed between an N-type semiconductor layer 123 and the first substrate 210. If the first substrate 210 is insulative like sapphire, the buffer layer 150 may be formed of a conductive material. On the other hand, if the first substrate 210 is conductive, the buffer layer may be formed of, for example, an insulating or semi-insulating material having a common thickness of tens of nanometers, such as AlN or GaN.

The semiconductor lamination structure 120 may be formed by sequentially is laminating the N-type semiconductor layer 123, an active layer 125 and a P-type semiconductor layer 127 on the buffer layer 150 formed as described above.

Here, the N-type semiconductor layer 123 may be formed of N-type $Al_xIn_yGa_{1-x-y}N$ ($0 \le x, y, x+y \le 1$), and may include an N-type clad layer. Further, the P-type semiconductor layer 127 may be formed of P-type $Al_xIn_yGa_{1-x-y}N$ ($0 \le x, y, x+y \le 1$), and may include a P-type clad layer. These semiconductor layers 123 and 127 may be grown using a known deposition process such as MOCVD, MBE or HVPE. In an embodiment, a transparent electrode layer (not shown) made of a metal or metal oxide such as Ni/Au, ITO, TCO or ZnO may be formed on the P-type semiconductor layer 127.

Subsequently, the bonding layer 300 and the second substrate 220 attached to a bottom surface of the bonding layer 300 are removed from the substrate assembly 400 using a method such as etching or laser irradiation (S750). Specifically, the bonding layer 300 and the second substrate 220 may be simultaneously separated from the substrate assembly 400 by immersing a portion of the substrate assembly 400 on which the semiconductor lamination structure 120 is formed so that the bonding layer 300 is etched. Alternatively, the bonding layer 300 and the second substrate 220 may be separated from the substrate assembly 400 by sequentially irradiating laser to the second substrate 220 and the bonding layer 300. However, the scope of the present invention is not limited to a specific method of removing the bonding is layer 300 and the second substrate 220.

Subsequently, a bottom surface of the first substrate 210 is thinly ground to a desired thickness through a lapping process, and the first substrate 210 having a plurality of semiconductor lamination structures 120 thereon is cut into individual light emitting devices (see FIG. 6) through a dicing process, thereby simultaneously fabricating a number of light emitting devices (S760).

After separating the second substrate 220 by etching, the process may further include separating the first substrate 210 by Laser Lift Off (LLO) or etching. An additional vertical type structure may be formed by bonding a bonding substrate to the opposite side of the light emitting cell before or after separating the second substrate 220 by etching, or by bonding a bonding substrate before separating the first substrate 210 by Laser Lift Off (LLO) or etching.

Although some embodiments of the present invention are described for illustrative purposes, it will be apparent to those skilled in the art that various modifications and changes can be made thereto within the scope of the invention without departing from the essential features of the invention. Accordingly, the aforementioned embodiments should be construed not to limit the technical spirit of the present invention but to be provided for illustrative purposes so that those skilled in the art can fully understand the spirit of the present invention. The scope of the present invention should not be limited to the aforementioned is embodiments but defined by appended claims. The technical spirit within the scope substantially identical with the scope of the present invention will be considered to fall in the scope of the present invention defined by the appended claims.

The invention claimed is:

1. A substrate assembly, comprising:
   a first substrate;
   a second substrate; and
   a bonding layer completely filling the area between the first substrate and the second substrate,
   wherein the thermal expansion coefficient of the bonding layer is smaller than or equal to that of at least one of the first substrate and the second substrate,
   wherein the first and second substrate physically contact the bonding layer, and
   wherein sides of the first and second substrates facing each other have the same surface area.

2. The substrate assembly of claim 1, wherein the first substrate and the second substrate are homogeneous.

3. The substrate assembly of claim 2, wherein the first substrate and the second substrate comprise sapphire.

4. The substrate assembly of claim 1, wherein the bonding layer comprises at least one of a nitride semiconductor, a silicon oxide ($SiO_x$), a silicon nitride ($SiN_x$), a mixture thereof, and a metal comprising Ti, Cr, Ni, Cu, W, Au, Ag, or an alloy thereof.

5. The substrate assembly of claim 4, wherein the bonding layer is formed on a first surface of at least one of the first substrate and the second substrate using plasma enhanced chemical vapor deposition, sputtering, or plating.

6. A method of forming a light emitting device, the method comprising:
   forming a bonding layer on at least one of a first substrate and a second substrate;
   bonding the first substrate and the second substrate to each other, the bonding layer being interposed between the first substrate and the second substrate;
   forming at least one semiconductor lamination structure on the first substrate;
   removing the bonding layer and the second substrate after the formation of the at least one semiconductor lamination structure; and
   grinding the first substrate,
   wherein sides of the first and second substrates facing each other have the same surface area.

7. The method of claim 6, wherein the first substrate and the second substrate are homogeneous.

8. The method of claim 7, wherein the first substrate and the second substrate comprise sapphire.

9. The method of claim 6, wherein the bonding layer comprises at least one of a nitride semiconductor, a silicon oxide ($SiO_x$), a silicon nitride ($SiN_x$), a mixture thereof, and a metal comprising Ti, Cr, Ni, Cu, W, Au, Ag, or an alloy thereof.

10. The method of claim 9, wherein the bonding layer is formed using at least one of plasma enhanced chemical vapor deposition, sputtering, and plating.

11. The method of claim 6, further comprising dicing the first substrate.

12. The method of claim 6, wherein the thermal expansion coefficient of the bonding layer is smaller than or equal to the thermal expansion coefficient of at least one of the first substrate and the second substrate.

13. The method of claim 6, wherein the at least one semiconductor lamination structure comprises a first type semiconductor layer, an active layer, and a second type semiconductor layer.

14. The method of claim 13, wherein the thermal expansion coefficient of the bonding layer is smaller than or equal to the thermal expansion coefficient of at least one of the first substrate and the second substrate, and
wherein the thermal expansion coefficient of the bonding layer is greater than or equal to the thermal expansion coefficient of at least one of the first type semiconductor layer and the second type semiconductor layer.

15. The method of claim 6, wherein the at least one semiconductor lamination structure comprises a plurality of semiconductor lamination structures, each semiconductor lamination structure comprising a first type semiconductor layer, an active layer, and a second type semiconductor layer.

16. The method of claim 15, further comprising dicing the first substrate after removing the bonding layer and the second substrate,
wherein dicing the first substrate comprises forming one semiconductor lamination structure of the plurality of semiconductor lamination structures on the first substrate.

17. A substrate assembly, comprising:
a first substrate;
a second substrate;
a bonding layer disposed between the first substrate and the second substrate; and
a semiconductor lamination structure arranged on the first substrate, the semiconductor lamination structure comprising a first type semiconductor layer, an active layer, and a second type semiconductor layer,
wherein the first substrate is disposed between the semiconductor lamination structure and the second substrate,
wherein the thermal expansion coefficient of the bonding layer is smaller than or equal to the thermal expansion coefficient of at least one of the first substrate and the second substrate, and
wherein sides of the first and second substrates facing each other have the same surface area.

18. The substrate assembly of claim 17, wherein the thermal expansion coefficient of the bonding layer is greater than or equal to the thermal expansion coefficient of at least one of the first type semiconductor layer and the second type semiconductor layer.

* * * * *